United States Patent [19]

Doshi et al.

[11] Patent Number: 4,725,971
[45] Date of Patent: Feb. 16, 1988

[54] DIGITAL SYSTEM SIMULATION METHOD AND APPARATUS

[75] Inventors: Mahesh Doshi, Framingham; Roderick B. Sullivan, II, Natick, both of Mass.

[73] Assignee: Prime Computer, Inc., Natick, Mass.

[21] Appl. No.: 576,446

[22] Filed: Feb. 2, 1984

[30] Foreign Application Priority Data

Nov. 3, 1983 [WO] PCT Int'l Appl. ............... 83/01741

[51] Int. Cl.⁴ .................... G06G 7/48; G06F 11/00
[52] U.S. Cl. ................................ 364/578; 364/200; 371/23; 371/26
[58] Field of Search ............ 364/200, 578, 553, 490; 371/23, 20, 24–27

[56] References Cited

U.S. PATENT DOCUMENTS

| | | | |
|---|---|---|---|
| 3,794,981 | 2/1974 | O'Connor | 364/200 |
| 4,064,394 | 12/1977 | Allen | 364/200 X |
| 4,205,370 | 5/1980 | Hirtle | 364/200 |
| 4,306,286 | 12/1981 | Cocke et al. | 364/200 |
| 4,308,616 | 12/1981 | Timoc | 371/23 |
| 4,342,093 | 7/1982 | Miyoshi | 371/23 X |
| 4,494,191 | 1/1985 | Itoh | 364/200 |
| 4,527,249 | 7/1985 | Van Brunt | 371/23 X |
| 4,584,642 | 4/1986 | Fudanuki | 364/200 |
| 4,587,625 | 5/1986 | Marino, Jr. et al. | 364/578 |
| 4,628,471 | 12/1986 | Schuler et al. | 364/578 |

OTHER PUBLICATIONS

Mano, M., *Digital Logic and Computer Design*, pp. 72–87, 1979.
1978 IEEE International Symposium on Circuits and Systems Proceedings, 17th–19th May 1979, New York, pp. 5–10, IEEE, New York, G. R. Case, "The Salogs Digital Logic Simulator".
IBM Technical Disclosure Bulletin, vol. 25, No. 1, Jun. 1982, pp. 138–145, New York, G. S. Miranker, "Logical, Device Level Simulation of MOS Networks".
Krontstadt et al, "Software Support for the Yorktown Simulation Engine", 19th Design Automation Conference, 1982 IEEE, paper 7.3, pp. 60–64.
Denneau, "The Yorktown Simulation Engine", 19th Design Automation Conference, 1982 IEEE, paper 7.2, pp. 55–59.
Pfister, "Yorktown Simulation Engine: Introduction", 19th Design Automation Conference, 1982 IEEE, paper 7.1, pp. 51–54.

*Primary Examiner*—Errol A. Krass
*Assistant Examiner*—Joseph L. Dixon
*Attorney, Agent, or Firm*—Lahive & Cockfield

[57] ABSTRACT

A digital system simulation apparatus and method enable a user to interactively control, during simulation, the sampling of signals in the digital system whose behavior is being simulated. The behavior of the system can be approximated better by recognizing and allowing a precise definition of element outputs even though the element inputs can include undefined variables. The apparatus allows efficient and better utilization of system memories by providing the capability of defining multiple outputs of the circuit elements in a single instruction when those outputs all have common inputs.

25 Claims, 18 Drawing Figures

DIGITAL SYSTEM SIMULATION METHOD AND APPARATUS

The invention relates generally to digital system testing equipment and methods, and in particular, to a digital system simulation apparatus and method for investigating, through simulation, the behavior of a digital system design prior to hardware construction.

BACKGROUND OF THE INVENTION

As digital circuitry and systems become more complex, and as the use of large scale circuit integration increases, it becomes increasingly important to ensure that a digital circuit design is accurate and performs to specification. On the other hand, however, it is also increasingly difficult, as the circuit complexity increases, to construct and test the actual integrated circuit chip. The difficulties include the time delays and expense involved in both construction and the eventual debugging of the chip. As a result therefore, there has been developed a family of digital system simulation apparatus and methods to check circuit design and provide error analysis without actually constructing the circuit either in discrete hardware components or in integrated circuit form.

Among the many systems which are available to perform simulation, perhaps the largest capacity system is that apparatus designed by IBM and known as the Yorktown Simulation Engine. This is a highly parallel, special purpose, programmable machine for the gate-level simulation of digital logic. It can operate at speeds of over 2 billion gate simulations per second.

The Yorktown Simulation Engine is an outgrowth of logic simulators which were developed as early as the mid-fifties. During the mid-fifties and early sixties, gate level simulation which however did not include delays, was available. In the later sixties and early seventies, gate level simulation employing some limited timing became availabe but was of limited use because of the amount of detail required to provide the logic simulation. Then, in the mid- to to late seventies, a well-known and well-supported system known as TEGAS was developed for the high level simulation of VLSI logic. This logic could employ for example thousands of logic gates. Also, in the late seventies, better simulation tools began to be developed, primarily for in-house use.

These simulation devices thus enabled the debugging of printed circuit boards which was previously both time consuming and not error free. However, component tolerances continue to provide significant problems. Furthermore, as noted above, VLSI and LSI, with its very large number of components, are still very difficult to check in a practically priced, flexible system. And today, as LSI and VLSI chips are used in printed circuit boards, yet more problems are to be expected.

Therefore primary objects of the invention are improved simulation apparatus and methods, available at reasonable cost, for enabling more system flexibility, more user control over the simulation system, and for providing additional simulation capability with respect to signal input and output, monitoring, system debugging, and operator/machine interaction.

SUMMARY OF THE INVENTION

The invention relates to an apparatus and method for simulating the behavior of a digital system. The digital system has a plurality of connected circuit elements. The apparatus features circuitry for defining inputs to the circuit elements and capable of having at least four signal levels. The levels include a "0" signal level, a "1" signal level, a high impedance "Z" signal level, and an unknown "X" signal level. Circuitry further defines outputs of the circuit elements based upon the input signals and capable of having at least the four signal levels. The output defining circuitry, however, includes circuitry for providing a "0" or a "1" output signal level even though one or more of the input signal levels are at either a "Z" or an "X" signal level.

The simulation apparatus further includes circuit elements which are standard building blocks and which have as inputs, a first input port, a second input port, and a carry-in port, and as outputs, at least a first output port and a carry-out port.

In another aspect, the apparatus for simulating the behavior of a digital circuit having a plurality of connected circuit elements features each circuit element having a defined input/output causal relationship. Circuitry is provided for tracing the signal value of at least one of the circuit element inputs and outputs for at least a selected change of condition of a logical combination of the inputs and outputs. Further circuitry provides a message display capability for displaying messages describing the traced circuit element inputs and outputs at times when the selected condition defined by the logical combination is attained.

In yet another aspect of the preferred embodiment of the invention, the apparatus features circuitry for establishing functional relationships between at least some of the circuit element inputs and outputs. A table look-up element stores the functional relationships as a plurality of table entries, each entry having an address which is a function of the input signal levels to the selected circuit element. The table is characterized by plural output entries for at least one combination of the inputs which defines a specific table entry address. The table entry is addressed by those inputs.

As noted above, the invention relates both to the apparatus as described above and the method related thereto. In a particular aspect, the method features allowing a defined output of a circuit element to assume a "0" or a "1" output level even though one or more of the inputs defining the output thereof are "Z" or "X".

In another aspect of the invention, the method features tracing signal values of at least one of the circuit element inputs and outputs for at least a selected change of condition of a logical combination of the circuit elements inputs and outputs, and for thereafter displaying messages describing each traced circuit element input and output at times when the selected condition is attained.

In yet another aspect, the method features the steps of establishing functional relationships between at least some circuit element inputs and outputs and storing the functionally related inputs and outputs in a table look-up memory wherein the memory has plural output entries associated with at least one table input entry. The method further features the capability of automatically combining separately defined functional relationships in the table for a circuit element wherein outputs of the circuit element are defined by common inputs. This feature provides for more efficient and reliable operation according to the inventive method.

BRIEF DESCRIPTION OF THE DRAWINGS

Other objects, features, and advantages of the invention will appear from the following description of a preferred embodiment taken together with the drawings in which.

DESCRIPTION OF THE PREFERRED EMBODIMENT

Figure 1:
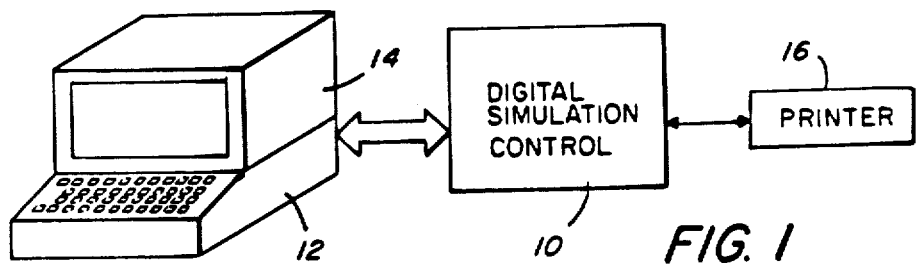
FIG. 1 is a schematic representation of the simulation apparatus according to the invention.

Referring to FIG. 1, a digital simulation system has a digital control circuitry 10 which connects to a keyboard 12, a monitor 14, and a printer 16. The digital simulation system will be described hereinafter in terms of a software controlled system although it could also be hardwired. The control circuitry 10 receives data information from the keyboard over, for example, a direct wire connection, a telephone line, or a small area or large area data communications network. In a similar manner, control circuitry 10 can supply display data to monitor 14. The printer 16 can be located either at the digital simulation control 10, or at another location, for example local to the keyboard and monitor, and can be connected to the control 10 through the same communication link as the keyboard and monitor.

As noted above, the illustrated embodiment of the invention is described and implemented primarily in software, illustrated in appendix A attached attached to U.S. Pat. No. 4,628,471 incorporated herein by reference, and the control apparatus 10 is a general purpose digital computer including a computer processing unit, RAM, and auxiliary memory. However, any or all functions and components of the system can be constructed solely in hardware. By implementing the apparatus solely in hardware, a considerable loss of flexibility results, for example it is difficult to change a hardwired system; however on the other hand, the hardwired system will generally provide faster response time to the data inputs and a greater operating speed. The construction of a hardwired system, in view of the disclosure hereinafter provided, is well within the skill of one practiced in the art.

Figure 2:
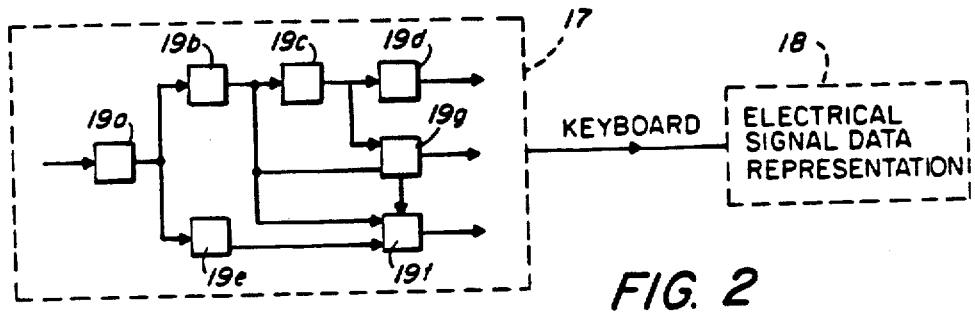
FIG. 2 is a diagrammatic representation of the transformation from circuit description to electrical signal representation of a digital system to be analyzed.

The general operation of the digital simulation control 10 is as follows. Referring to FIG. 2, the operator defines, through the keyboard, a circuit 17, the behavior of which to be simulated; and the control circuitry automatically provides an electrical signal data structure 18 describing the digital system. This occurs at what is generally called the command level of operation.

The commands from the operator, through keyboard 12, to the digital simulation control 10 provide the digital simulation control with a unique definition of the interconnections of the digital circuit elements 19a, 19b, . . . , 19g making up the illustrated circuit 17. Those commands or instructions from the keyboard thus provide a complete description of how the circuit elements are connected. The circuit elements themselves are electrical elements with a set of "external pins" that define how the electrical elements can be connected to other elements of the circuit. The elements can be user defined or can be standard electrical building blocks, for example AND gates, OR gates, digital adders, etc. Each element of the circuit can have none, one, or several models associated therewith that define the alternatives for the element's functional performance when it is used during a logic simulation. An element can represent a real physical component, a portion of a real component, or a conceptual and hence generally non-physical component. An element is defined by its "component name" and can be referenced thereby.

Figure 3:
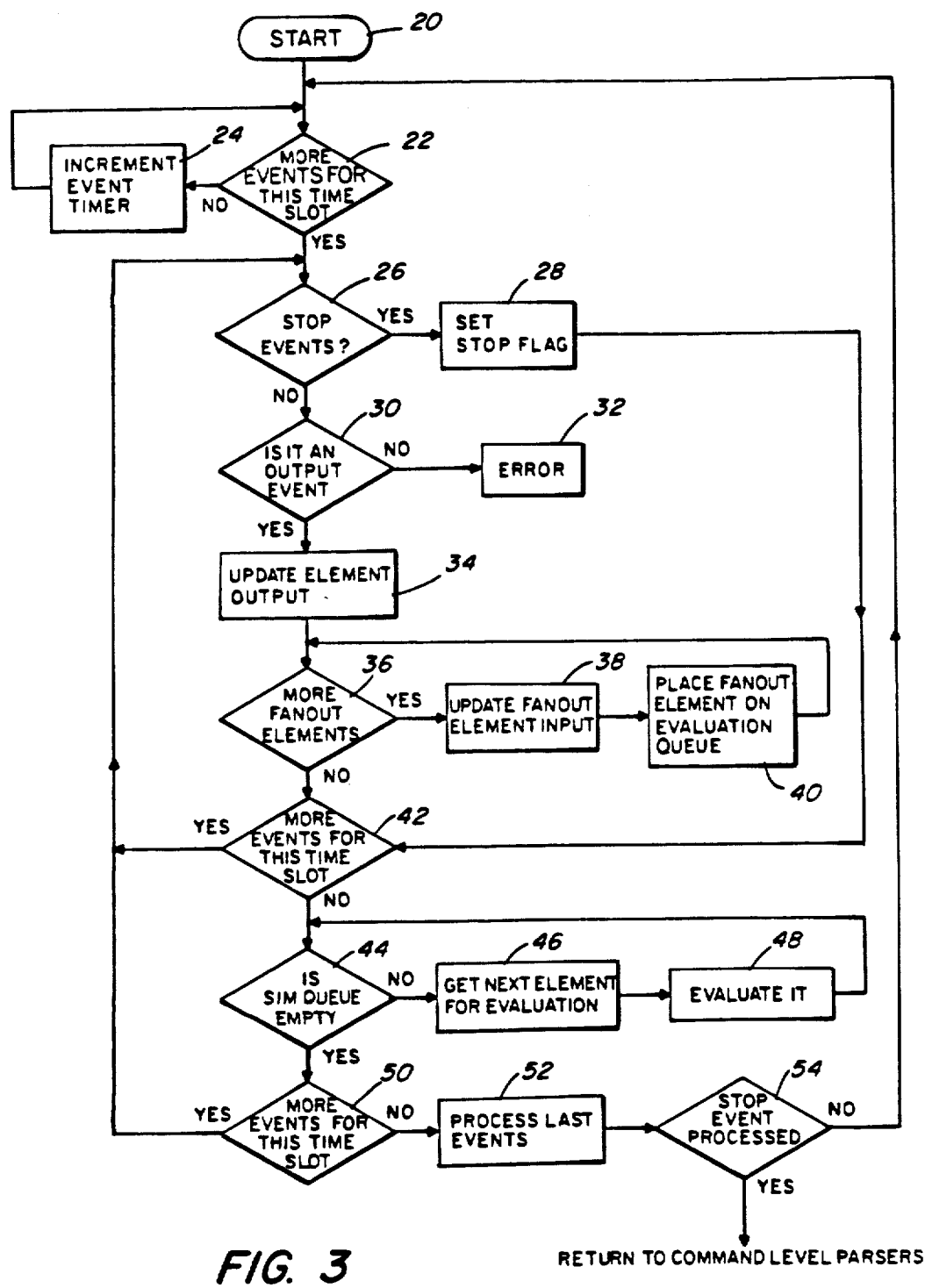
FIG. 3 is a flow chart illustrating generally a simulation control process.

Input waveforms to the circuit are then specified by the operator, and commands from the keyboard 12 initiate simulation by the simulation control 10. This is indicated in FIG. 3 at 20. The apparatus employs an event timer, which is a unitless timer having a "time slot" for each unit of time as defined by the operator. During a time slot (or unit of time), a complete update of the digital circuitry input/output relationships will take place. The time slot can be on the order of nanoseconds or microseconds depending upon the nature of the digital system. The apparatus then maintains a list or schedule of the "events" or happenings during each time slot, and all of the events scheduled during a time slot are accounted for before the events scheduled for a next time slot can be considered. The events can be, for example, the changing of an output value, the monitoring of a value, the setting of a stop flag to indicate the processing of a "stop event", the propagation of a signal through a series of connected gates, etc.

As noted above, once the elements have been connected and defined in the digital simulation control data structure, (by entering the necessary data through the keyboard, using visual feedback and prompting from the monitor 14) the command is entered, through the keyboard, to start the simulation. During the entry of the various elements, the digital simulation control circuits had been preparing a command list describing all of the elements, modeling them, and recording their interconnections. When the start command is given, as indicated at 20 of FIG. 3, the apparatus begins a first clock cycle (or time slot) to determine whether there are any "events" scheduled to take place during this first time slot or cycle. This is indicated at 22. If no event is scheduled to take place during a time slot, the digital simulation control clock counter (referred to hereinafter as the event timer) increments, as indicated at 24, and the apparatus examines whether any "events" are to take place during the next time slot.

If an event is to take place during the time slot, the apparatus determines whether it is a "stop event" (at 26) in which case a stop flag is set at 28, or whether it is an "output event" (at 30). An output event requires the generation and update of output signal levels for the circuit element based upon input signal levels to the element. If an event is scheduled, but is neither an output event (indicated at 30) nor the stop event, an error condition is indicated at 32.

Each output event causes particular circuit element output or outputs to be updated (at 34). A determination is then made (at 36) whether there are circuit elements downstream, that is, output receiving elements which are affected by the updated output. If there are affected elements downstream, their inputs are updated at 38 and thereafter those "fanout" elements are scheduled on the evaluation or simulation queue at 40. This means that at some later time (which can be within the same time slot), as specified in the definition for the particular circuit element, its output will be updated. Each time the loop defined by elements 36, 38, and 40 is traversed, another element 19, downstream of the "event" element is updated.

When all of the "downstream" elements for an event have been updated, the scheduling data is examined to determine if there are more events scheduled to occur during this "time slot" (indicated at 42). If more events are called for, the apparatus control returns to block 26 to begin determining the type of the next event. If there are no additional events, then the apparatus control determines whether the evaluation queue is empty for this time slot. This is indicated at 44. If it is not empty, the next element to be evaluated is obtained, at 46, and the element is evaluated at 48. The loop comprising element 44, 46, and 48 is repeatedly traversed until it is empty. Thereafter, the apparatus determines, at 50, whether there are more "events" occurring during this time slot. These events would have been generated and scheduled during the evaluation of the elements in the evaluation queue at 48. If addition events are scheduled for this time slot, control returns to the stop event determination at 26.

If no additional events are to take place during this time slot, the apparatus, at 52, processes "last events". The "last events" are a special class of control events for which processing, for each time slot, occurs only after all other events in the time slot have been processed. "Last events" can include for example, evaluations relating to monitoring, tracing, sampling, breakpoints, etc. After the "last events" have been processed, the apparatus control determines, at 54, whether the stop flag has been set, indicating that the stop event has been processed, and if the stop flag has not been set, the apparatus returns to the beginning of the processing method. In the event that the stop flag has been set, indicating the processing of a stop event, the apparatus returns to the "command level" parsers for further operation and the simulation stops, at least temporarily.

As noted above, during the command level of operation, the apparatus user has the capability of defining the input circuit elements through the keyboard 12. (He can also use the system defined standard building blocks, such as adders, subtractors, AND or OR gates, etc.) In the illustrated embodiment of the invention, he has the capability of defining those circuit elements so that for a single particular combination of inputs, multiple outputs can be defined and further, so that an output can be defined as a "0", or a "1" even though an input to the circuit element is an undefined or high impedance signal level.

Referring in particular to that aspect of the apparatus having the capability of defining multiple outputs for a common set of input pins of a circuit element, which the apparatus control 10 receives input data defining a circuit element from the user, through the keyboard 12, the apparatus generates and stores in memory, a "lookup table" which models the functional relationship between the inputs and outputs of the circuit element. For example, the user can define each output signal level separately base upon a logical or Boolean function of the value of the inputs (and outputs), or a specific functional relationship can be defined. The apparatus control 10 automatically combines in its data structure separately defined outputs which have a common set of inputs or allows the user to define for a common set of inputs, a plurality of outputs. The resulting "look-up table" takes the form of a stored data structure having a one-dimensional array of pointers to the new outputs values, the array being indexed by the current set of input (and output) signal values, hereinafter referred to as the "current state input vector" for the circuit element. Each data entry in the one-dimensional array list points to (and hence represents) the new output value(s) for the particular inputs forming the current state vector. The apparatus then "schedules" updating of the new output values.

Figure 4:
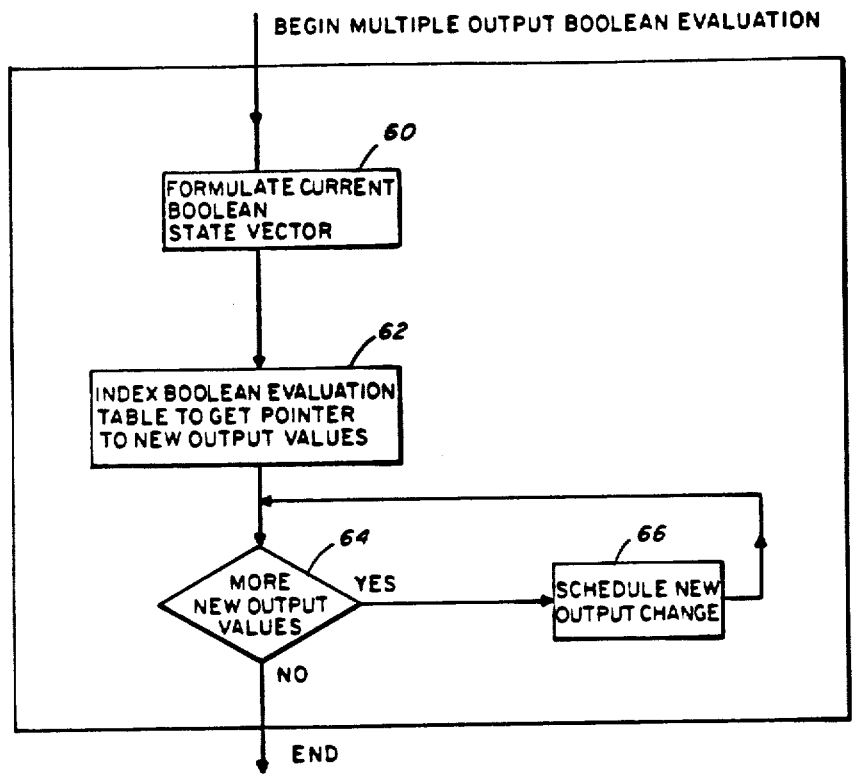
FIGS. 4 and 5 represent the method steps for a first aspect of the invention.
Figure 5:
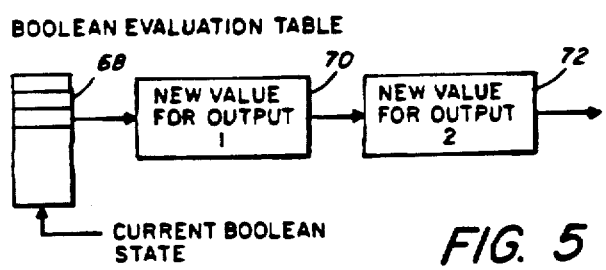

During a typical simulation, therefore, when an output event is detected at 30, the element output value update indicated at 34 can be implemented as illustrated in FIGS. 4 and 5. The current state vector, that is, the definition of element inputs and outputs which define the current input state to the circuit element, is formulated at 60 and is employed with the one-dimensional array defined during the circuit formulation stage of simulation to obtain a pointer to the new output values of various outputs of the circuit element. This is indicated at 62. Thereafter, the output signal values are updated, by first determining, at 64, if there is an output value to be updated and then scheduling each new output value change, at 66, until all of the output changes for this circuit element have been scheduled. It should be noted that the output values change at times schedulued in accordance with the definition of the circuit element which, through user supplied data, will generally take into account the delays inherent in signal transmission through physical media, internal device time delays, etc. After all of the output value changes have been scheduled, the system continues to update other circuit elements, as noted at 36, for example those connected to those outputs of this circuit element, which change within this time period.

Referring in particular to FIG. 5, the one-dimensional array of pointers is illustrated at 68. The array, as noted above, is indexed by the input values to the circuit element; and the data stored therein points to the location in a memory of new values for the outputs as indicated at 70, 72, etc. In the illustrated embodiment, each time a new output value is obtained, the retrieved data also indicates the location of a next output, if any, whose output level is determined by this common set of input values. Thus the content of the data stored at 70 points to the new output value data stored at 72. Thereby, the present apparatus is capable of storing and using, in an efficient and reliable manner, multiple outputs related to a common set of inputs. Thus, a separate array and circuit element definition need not be set up for each output of a circuit element, where the signal level of the outputs are each functionally dependent upon a common set of inputs.

The apparatus further provides, for a circuit element having undefined or high impedance inputs, the capability of defining the output signal level as a "0" or "1" level. It is well-known, that, for example for an adder, the input values can be a "0", a "1", an "X" which is an undefined input variable, or a "Z" which is a high impedance input. Typically, for an add circuit, an apparatus can employ truth tables similar to those of FIG. 6. In the illustrated embodiment, however, unilke earlier apparatus, the result of, for example, a two operand add with a carry-in bit, has a defined "0" or "1" output level, such as at 76, even though one of the inputs to the adder is an "X" or a "Z". This method and apparatus thus allows the output of the adder to be "definite" even though the input is not and thereby provides a better correspondence to the actual operation of the digital system being simulated.

Figure 6:
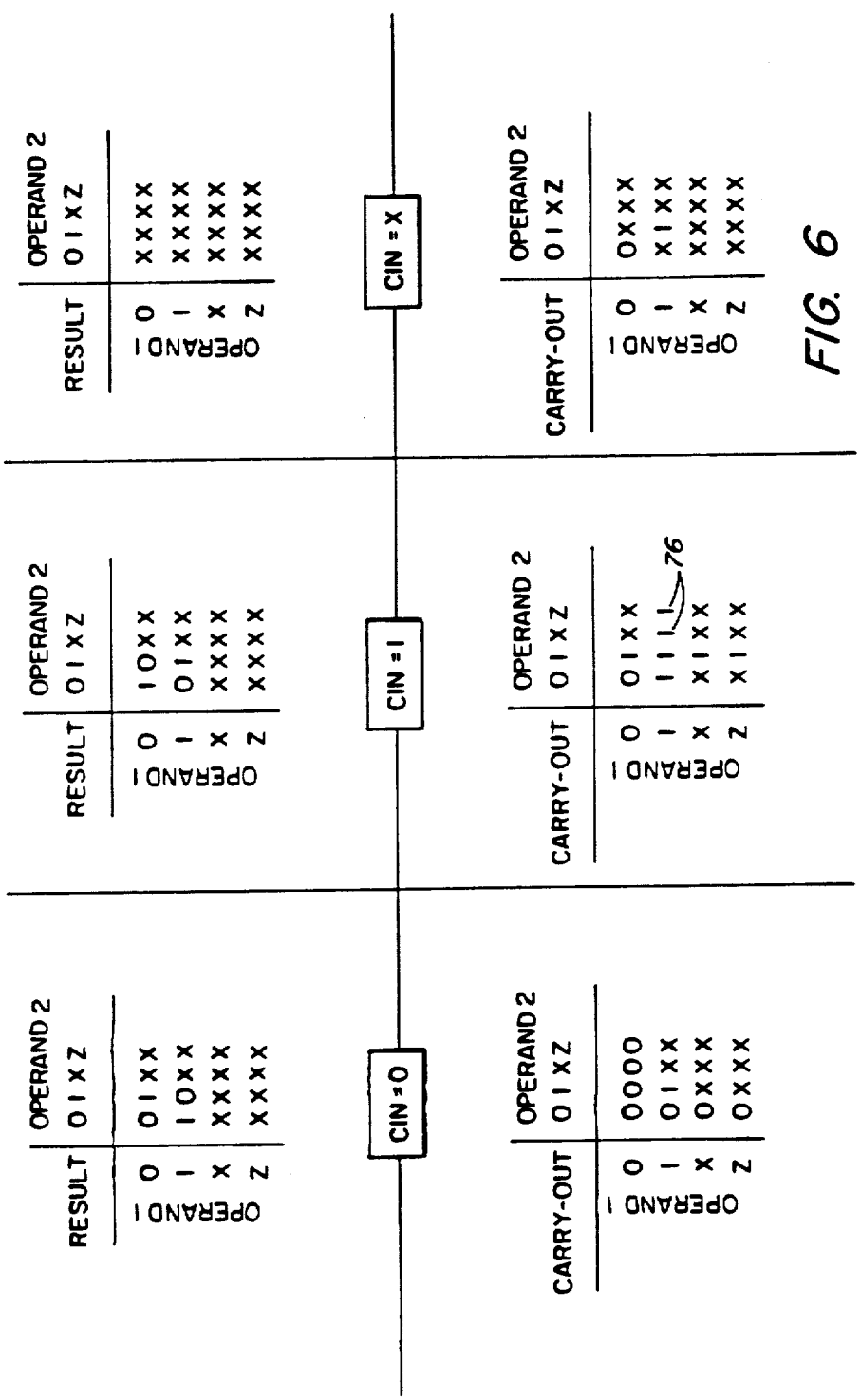
FIGS. 6 and 7 represent the method steps for a second aspect of the invention.
Figure 7:
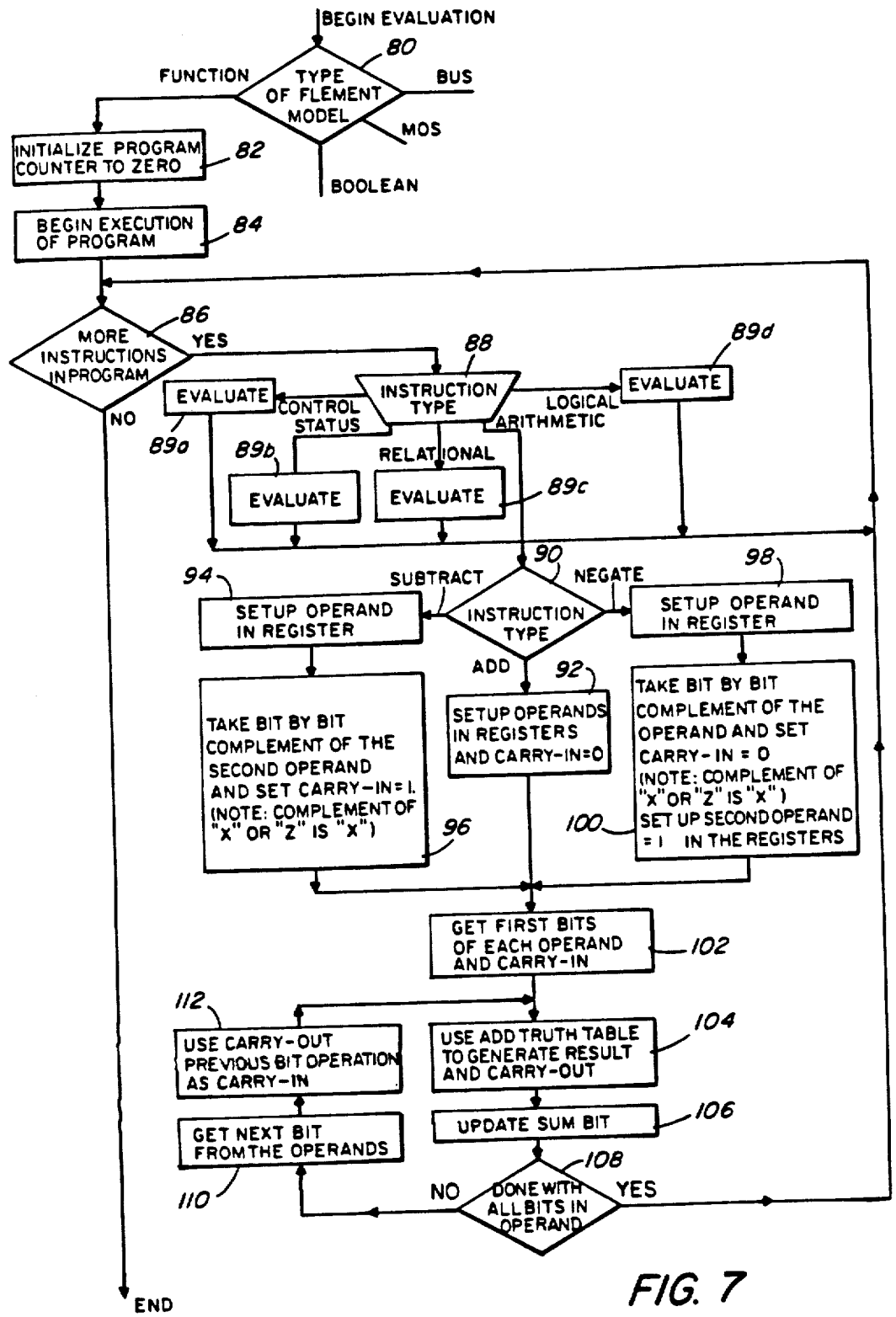

Referring now to FIG. 7, the evaluation of a function, such as an arithmetic function defined by the truth tables of FIG. 6, is described. This procedure corresponds to, for example, the evaluation indicated at 34 of FIG. 3. Initially, as the evaluation begins, the type of circuit element being modeled is determined. This is indicated at 80. Assuming in the present illustrated example that an arithmetic function is being modeled, the procedure for modeling the function is initiated at 82 and execution of the procedure begins at 84. In this illustrated embodiment, the procedure is implemented in a separately stored program which requires the computer program counter to be zeroed when the program is recalled and loaded into program member. Each "instruction" of the procedure or program as used herein represents one arithmetic step in evaluating the function. For example the step can be "add input A to input B". Upon noting the presence of a next instruction, at 86, the type of instruction is determined at 88. The various instructions can be a control instruction, a status instruction, a relational instruction, an arithmetic instruction, and a logical instruction. The evaluation of the various nonarithmetic instruction types (at 89a, 89b, 89c, 89d) will be obvious, in accordance with the present invention, in view of the discussion which follows relating specifically to arithmetic instructions.

If the instruction is an arithmetic instruction, the particular type of arithmetic instruction is then determined at 90. If the instruction is an ADD instruction, the operands are fetched and stored in operand registers and a "carry-in" bit is set to "0". This is indicated at 92. If a SUBTRACT instruction is called for, the operands are fetched and stored in the operand register at 94 and the complement of the second operand replaces the originally fetched operand. This is indicated at 96 (the complement of "X" or "Z" is "X"). The carry-in bit is set to "1". If a NEGATE instruction is called for, the operand is fetched and stored in one operand register at 98. The complement of the operand is then taken bit-by-bit and the carry-in bit is set to "0". This is indicated at 100. The second operand register is set to "1".

Having thus set up the operand registers and the carry-in bit, the first bit of each operand, and the carry-in bit, are fetched at 102 and the truth tables of FIG. 6 are employed (these are stored in the apparatus memory) to generate the resultant sum and a carry-out bit. This is indicated at 104. A sum bit register is then updated at 106 and the apparatus determines whether all of the bits in the operands have been used (at 108). If all of the bits have not been used, the next bit is fetched from the operand registers at 110 and the carry-out bit from the previous bit operation is employed as the new "carry-in" bit. This is indicated at 112. Thereafter the truth tables are employed again at 104 and the sum bits and carry-out bits are updated at 106. When all of the bits of the operands have been processed, the apparatus "loops back" to determine if more instructions are present in the program for this function, at 86, and if not, control returns to update the outputs of the function circuit element at 34 (FIG. 3).

As noted above, after the initial "element update" at 34, the apparatus determines whether there are additional (downstream) fanout element inputs at 38. In accordance with the illustrated embodiment of the apparatus, each element output signal is specified by a signal level which is calculated internally by the apparatus as being one of nine states. Three of those states have been previously described and designated as "0", "1", and "X". The remaining states according to this illustrated embodiment of the invention, are a "weak 0", a "weak 1", a "weak X", a "dynamic 0", a "dynamic 1", and a "dynamic X" signal level. As used herein, "weak" refers to a signal that is pulled to a given level or value through a resistor and "dynamic" refers to a signal whose level is provided by capacitively charging a line to a given value but which, with very little additional charge of an opposite type, can be changed to a signal level of the opposite value. The four signal-level simulation is adequate and reliable for gate level simulation. However, for switch level simulation, the nine signal-level simulation is desirable. Advantageously, the apparatus herein is capable of operating both in a four signal-level mode and in a nine signal-level mode depending upon the requirements of the circuit element to which the signals are being provided. Consequently, for convenience, each signal level output is initially described using the nine signal-level mode. However, when a gate or function is receiving the output value, the nine values are reduced to four by masking the "strength" from the "change code" defining the output levels, and updating the new input values with the now four level signals.

Figure 8:
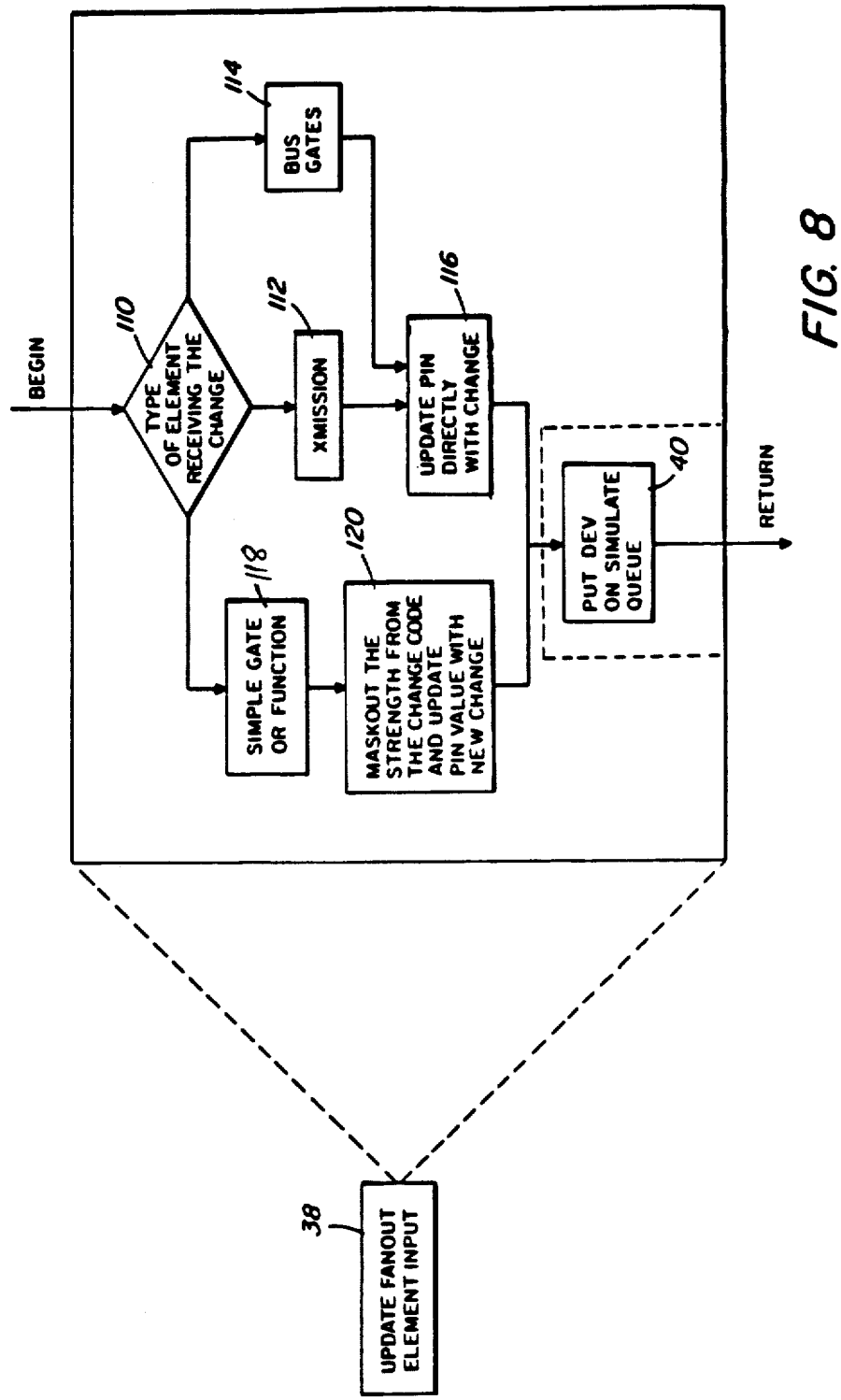
FIG. 8 represents the method steps for another aspect of the simulation apparatus and method.

Referring now to FIG. 8, the update fanout element input 38 initially determines, at 110, the type of circuit element which is receiving the change at its input. If the circuit element is a transmission element, for example a MOS transistor operating like a switch, indicated at 112, or a bus gate (which is user transparent and is inserted automatically by the system) as indicated at 114, the input pins of the circuit elements are directly updated with the nine level output change, as indicated at 116. Thereafter, the circuit element is placed on the simulation queue for scheduling, as noted at 40 in FIGS. 3 and 8.

If however, the receiving device is a simple gate or function, as indicated at 118, the signal level data or change code is processed by masking the strength data from the output. The new signal level change, then consisting of only a four state signal, updates the pin value, at 120, and the device is then placed as noted above on the simulation queue is 40. In this manner, the illustrated apparatus automatically, without user intervention, employs, as required, both the four level and nine level signals. Thereby, full capability of the system is maintained while reducing where possible the computational and memory requirements so that faster throughput is available. Thus, the strength information available to a gate or function, and which is irrelevant thereto, is masked before the change value is made available to the element input.

In order to properly evaluate the simulation and to observe the various signal paths and combinations during the simulation, the apparatus provides the user with the capability of tracing signals and viewing the result of the trace procedure. Importantly, in the illustrated embodiment of the invention, tracing of the signal can be triggered on the change of value of a functional (for example Boolean) combination of pins, data paths, registers, memories, or memory windows.

Figure 9:
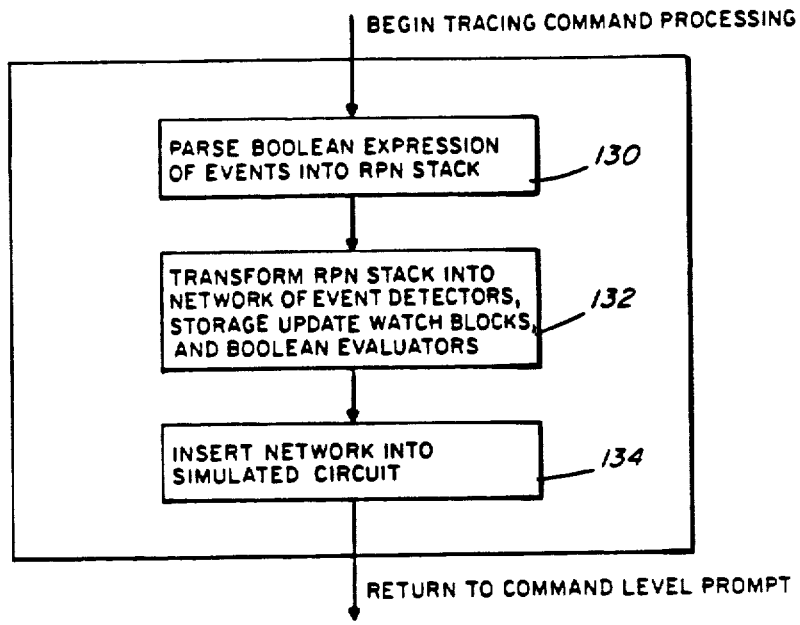

Referring to FIG. 9, when tracing is to be implemented, the operator provides the control 10 with the necessary information regarding the tracing procedure, including the functional expression, the satisfaction of which will trigger the trace message. The processing of the tracing command is initialized at the command level of the apparatus by parsing for example the Boolean expression of the events initiating a trace, into a stack, in Reverse Polish Notation (RPN). This is indicated at 130. The "RPN stack" is then processed to transform the parsed Boolean expressions into a network of event detectors, storage update watch blocks, and Boolean evaluators. This is indicated at 132. These elements become part of the defined circuit, the behavior of which is to be simulated, and are inserted into that circuit as would be any other circuit element. This is indicated at 134. The inclusion of these additional monitoring circuit elements is, however, transparent to the user, so that he is not aware of their inclusion into the circuit.

Figure 10:
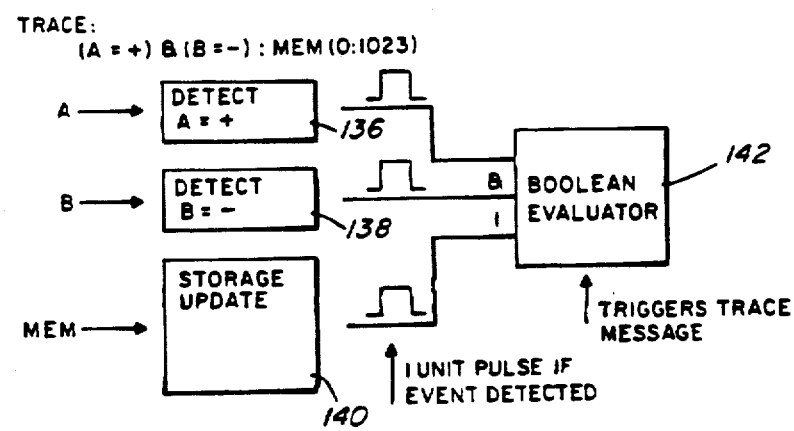

Referring to FIG. 10, the Boolean expression upon which a trace message is initiated is assumed to be [(A is positive) AND (B is negative)] OR (a change in memory location 1023). In this example, the apparatus traces upon either the detection of a circuit value A being positive when a circuit value B is negative, or a change in the value of the specific memory location. The detection of a positive A value and a negative B value is illustrated by a first and a second event detector 136, 138 respectively. A storage updated watch block 140 monitors the specified memory location. The event detector evaluation at 136, 138, and 140 is analogous to a simple gate evaluation. If the event is detected at 136 or 138, a one time-unit pulse is generated on the "output wire" which feeds a Boolean evaluator 142. The storage updated watch block receives the value of the memory location or locations to be monitored and intercepts storage updates of the selected registers. If an event is detected, the watch block 140 generates the one time-unit pulse and that pulse is received and detected by the Boolean evaluator 142. The Boolean evaluator detects the user specified Boolean combination of events and upon receiving the unit-time clock pulse triggers the generation of a trace message as described in more detail below if the Boolean combination is satisfied.

Figure 11:
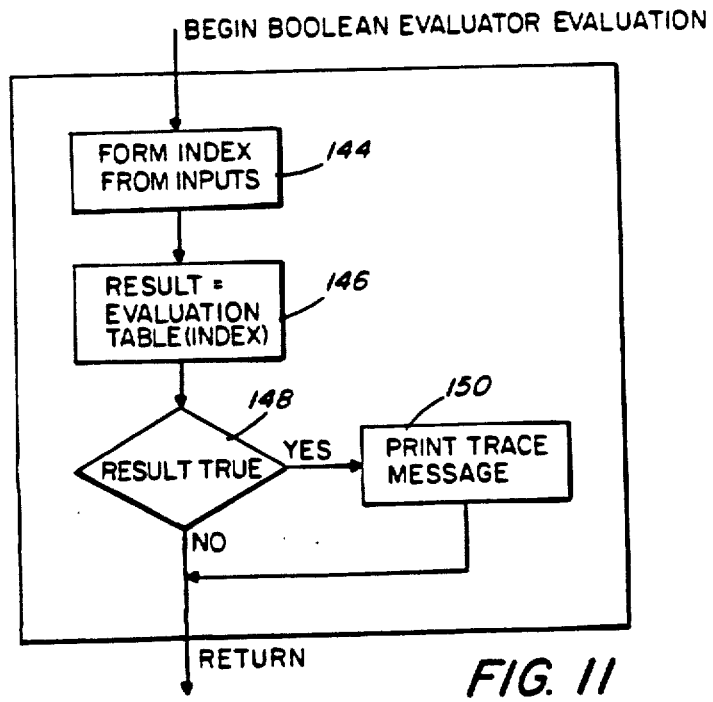
FIGS. 9-13 represent the method steps for a fourth aspect of the simulation apparatus and method.

Referring to FIG. 11, the Boolean evaluator forms an index from the inputs available to it. This is indicated at 144. The resulting index is evaluated in accordance with a previously generated and stored evaluation table, at 146, and if the table result is true, at 148, at trace print message is generated at 150. If the table result is false, at 148, the trace print message is not generated.

Figure 12:
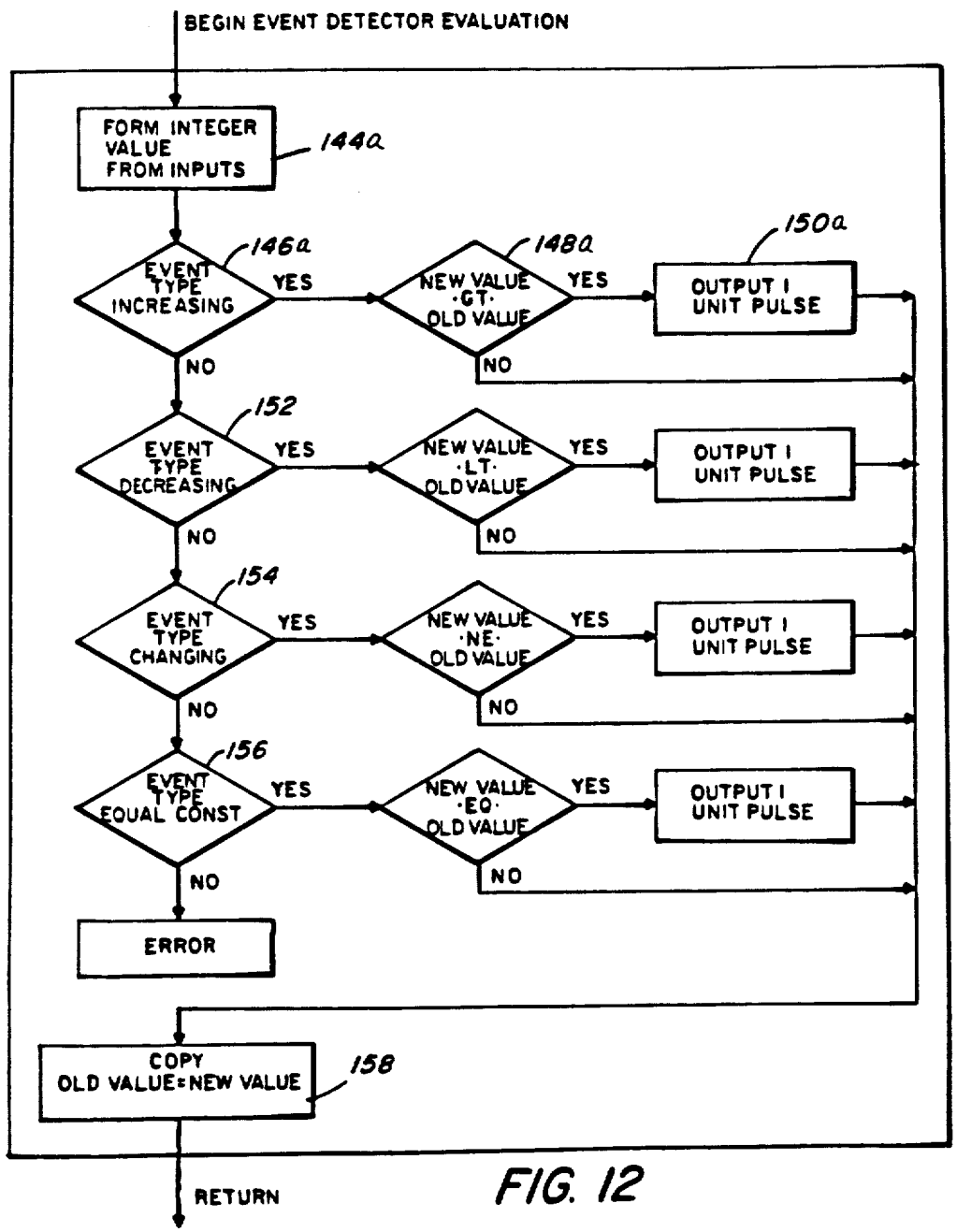

Referring to FIG. 12, the event detectors 136 and 138 operate by forming an integer value based upon the inputs thereto, the integer value indicating the type of event. This is indicated at 144a. If the event is of a type which is increasing, as indicated at 146a, a check is made whether the new value is greater than the old value (at 148a) and if it is, an output of a unit-time pulse is generated at 150a. If the new value is not greater than the old value, at 148a, the unit-time pulse is not generated. In a similar manner, checks are made for an event type wherein the event is decreasing (at 152), where the event is changing (at 154), and where the event is not changing but is constant (156). In each case, where the event is properly detected, the one unit time pulse is output. If the event is not properly detected, the one unit-time pulse is not output. The old value is then replaced by the new value of the monitored variable at 158. Similarly, if the negative output of blocks 146a, 152, 154, and 156 are all taken, an error condition is indicated at 160.

Figure 13:
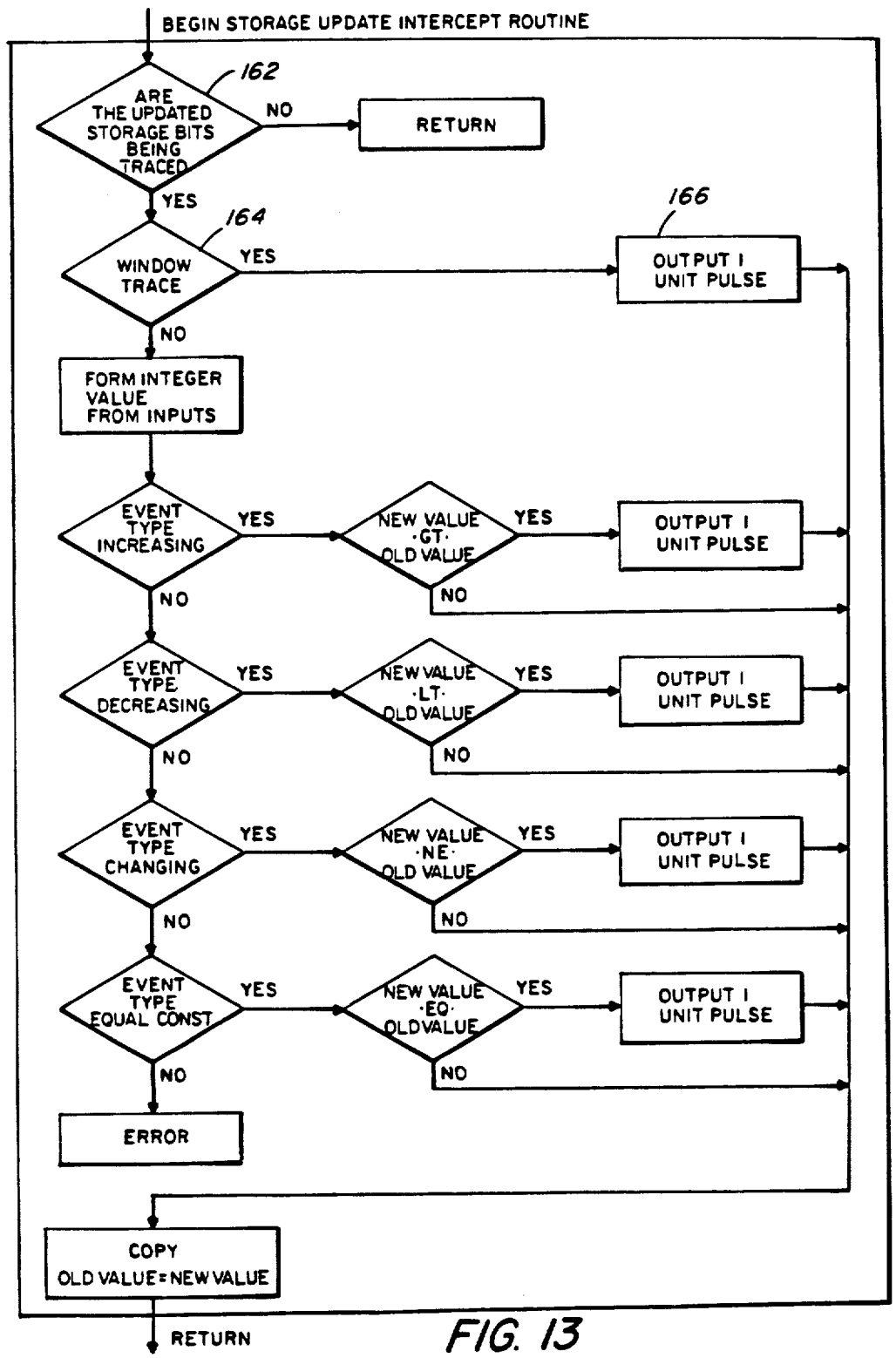

In a similar manner, referring to FIG. 13, the storage update watch block begins by checking whether the updated storage bits are the ones upon which a trace can be triggered. This is indicated at 162. If they are not, the control returns to other monitoring or evaluation processes. If the updated storage bits are being monitored, the apparatus determines whether it is a window trace at 164, in which case the output pulse is immediately generated at 166. Otherwise, the values being monitored are used to generate an integer value indicating the type of the event. Processing then follows using the same procedure as that described in connection with FIG. 12. Using the described process, tracing can be triggered by a functional combination of variables to monitor behavioral operation of the digital circuit 17. As in FIG. 12, if none of the tested events are found to exist, an error condition is indicated. Further, if the new value does not meet the required decision criteria relating to the old value, the unit pulse is not output.

In accordance with the illustrated and preferred embodiment, the apparatus provides the user with the further capability of interactively controlling sampling of waveforms not only at the time the circuitry is compiled (i.e. prior to actual simulation), but thereafter, during simulation itself. Thus, in accordance with the illustrated embodiment, the user can interactively specify, during the actual simulation, which elements are to be automatically or continuously sampled and have their values recorded; when to turn the sampling on and off; and whether to sample at every occurrence of a specified condition or whether to periodically sample on the Nth occurrence of the specified condition, for example in response to breakpoints. (The breakpoints, which can control sampling, can also be set interactively during the simulation period). The user can also direct the apparatus to automatically and continuously print, or display for viewing, the values of specified circuit elements inputs and outputs. Thus, according to the illustrated embodiment, if a user desires to view any of the automatically sampled values which have been stored or printed, the user can temporarily stop the simulation, examine the desired stored values or printed files, and then return to the simulation, continuing where the simulation had left off. This advantageous procedure differs markedly from earlier simulation systems wherein the simulation, once interrupted, cannot thereafter be resumed as if the interruption had not occurred.

Figure 14:
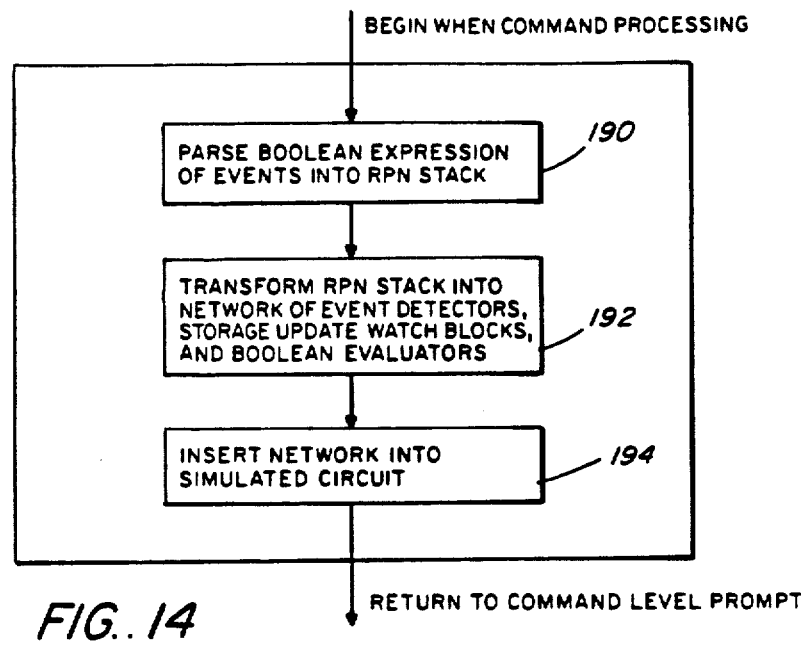
FIGS. 14-18 represent the method steps for a preferred embodiment according to the invention.

Referring in particular to FIG. 14, the apparatus treats a command to begin or terminate sampling upon the occurrence of one or more specified conditions in the same manner in which it treats the command to trigger printing or recording of a trace message upon the occurrence of a specified function, for example based upon a combination of ANDed or ORed variables. Thus, FIG. 14, which corresponds to FIG. 9, provides for parsing the expression, for example a Boolean expression, which specifies when to initiate (or terminate) sampling, into a Reverse Polish Notation (RPN) stack, (at 190); transforming the RPN stack into a network of event detectors, storage update watch blocks, and Boolean evaluators (at 192); and inserting the resulting circuit elements into the network whose behavior is to be investigated (at 194). Thus, when the Boolean evaluator, corresponding to that of FIG. 14, detects an event upon which a sample command is to be generated, a sampling method, corresponding to the tracing procedure of FIGS. 11-13, is initiated.

It should also be noted that the event detector and storage update watch block employed in connection with the detector circuitry and Boolean evaluator of FIG. 9 correspond precisely to those employed in connection with the sampling function herein described and that the operation of both corresponds to that described in connection with FIGS. 10, 12 and 13 respectively.

Figure 15:
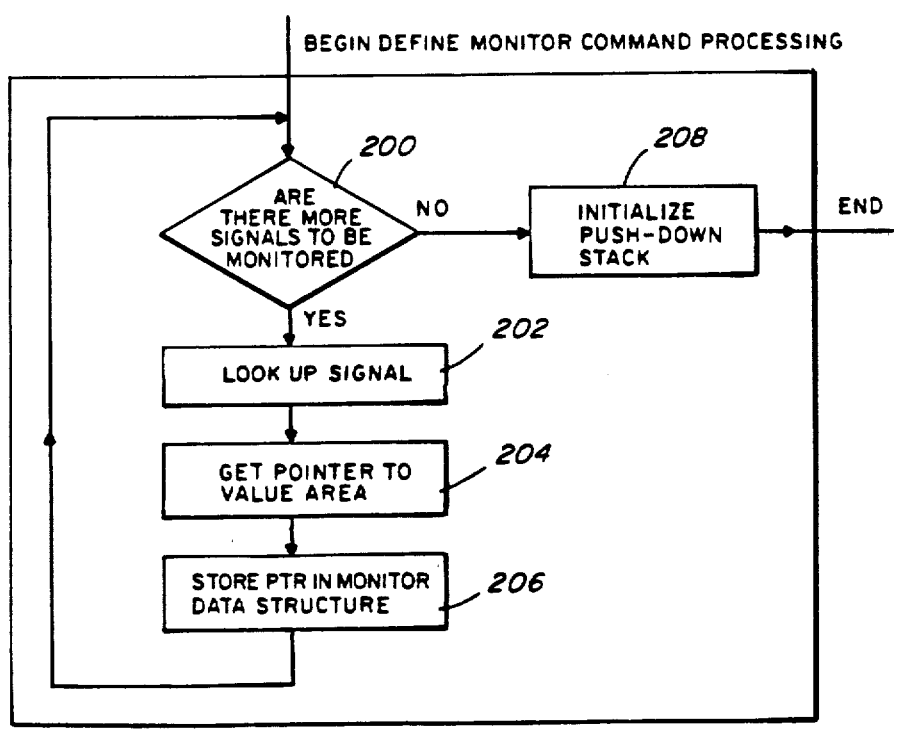

When a command from the keyboard to create an apparatus structure for initiating and controlling sampling has been processed as illustrated in FIG. 14, the apparatus, after the network elements have been fully described, sets up a monitor data structure identifying the signal inputs and outputs to be monitored. Referring to FIG. 15, the apparatus creates a data structure in memory which consists of pointers to the values of all signals which are to be monitored. Thus, if there are signals to be monitored, as determined at 200, the nature of the signal is determined at 202, and a pointer is obtained which directs the apparatus to the memory storage location containing the value of that signal. This is indicated at 204. Thereafter, that pointer is stored in a monitor data structure of memory, at 206, for later use. When all of the signals to be monitored have been processed in this manner, the apparatus initializes (for example clears) a push-down stack, at 208, and returns control to the command level processing.

Figure 16:
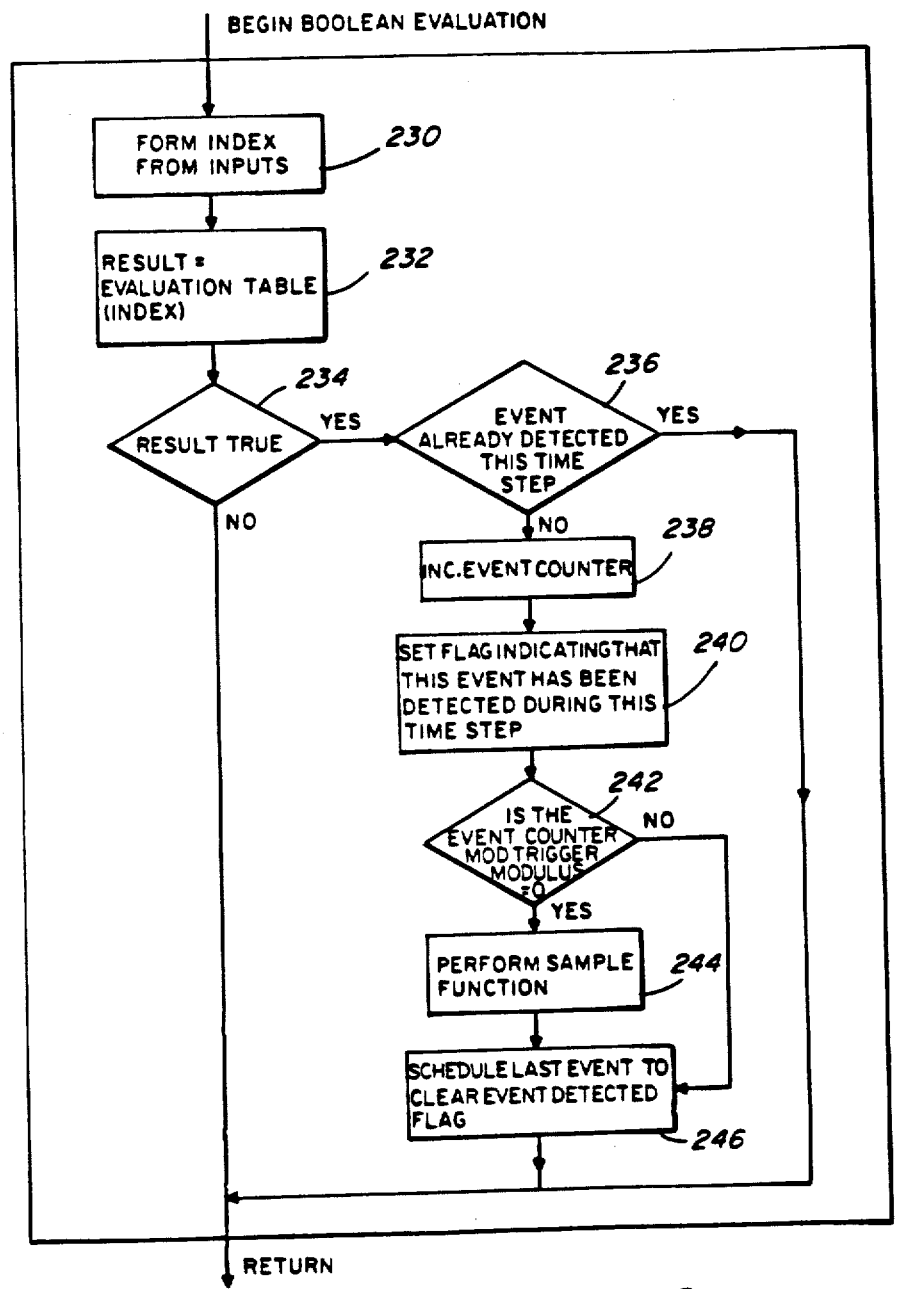

The Boolean evaluator used for initating sampling, referring to FIG. 16, forms an index based upon the inputs provided thereto. This is indicated at 230 and corresponds, as noted above, to the elements illustrated in FIG. 10. The result of the index is applied to an evaluation table (at 232), and if the evaluation table provides a "true" response to the index, at 234, the event (to perform a sample function) is detected. If the result at 234 is not true, control returns to the calling program. Once an event is detected, the determination is made whether that event has been detected previously in this time slot. This is indicated at 236. If the event has been detected, the Boolean evaluator circuitry returns control back to the main program. If the event has not been previously detected in this time slot, however, an event counter is incremented, at 238; and a flag is set, indicating that this event was detected during this specific time slot. This is indicated at 240. Thereby, the event and the time of the event are retained for later display and analysis.

It is next determined whether the event counter, modulo the trigger modulus, equals "0". This allows the apparatus to sample every Nth time that the event combination occurs (N=1, 2, 3, ...). If the variable is to be sampled each time the event is detected, the trigger modulus is "1". If, on the other hand the event is to be detected every four times, the trigger modulus is set to 4. It is important to point out that a separate count is set for each of the events upon which sampling can occur. Thus, one signal line can be sampled every Nth occurrence while a second signal line can be sampled every Mth occurrence. The apparatus is flexible enough to accommodate these different requirements. If in this time slot a signal sample is to be taken, as indicated by the determination modulo equal to "0", indicated at 242, the sampling function is performed (at 244). If, in this time slot, a signal sample is not to be taken, the sample function at 244 is not performed. Then, a "last event" is scheduled for this time slot, to clear the event detected flag set previously at 240. This is indicated at 246.

Figure 17:
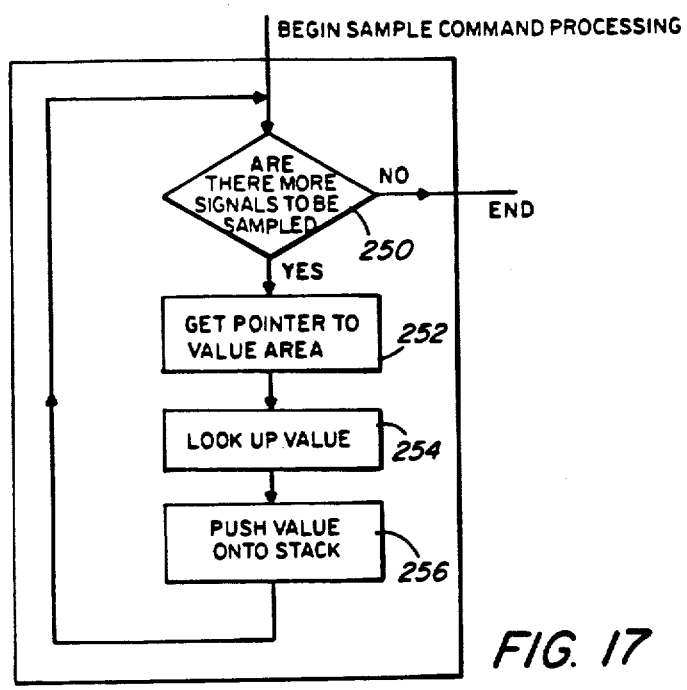

The sampling process which occurs during the simulation (as indicated at 244), is illustrated in FIG. 17. The apparatus first determines, at 250, if there is a signal to be monitored, for example by examining the monitor data structure. If there is a signal to be monitored and sampled, the pointer to the signal value is obtained at 252 and the value itself is then obtained at 254. That value is placed (at 256) in the push-down stack previously initialized at 208. When all of the signals to be sampled have been thus processed, the command processing continues at 246 (FIG. 16).

The results of the sampling process can viewed at the end of the simulation, however, it is desirable to provide the user with the capability of temporarily interrupting the simulation to view the sampled waveforms. Therefore, the apparatus and method provide a breakpoint capability for interrupting the simulation, viewing the sampled results, and thereafter resuming the simulation process where it had been interrupted. The breakpoints can be functionally related to a combination of signal values. The implementation and evaluation of the breakpoint corresponds to the implementation of the sampling and tracing procedures described in connection with FIGS. 9-18.

Figure 18:
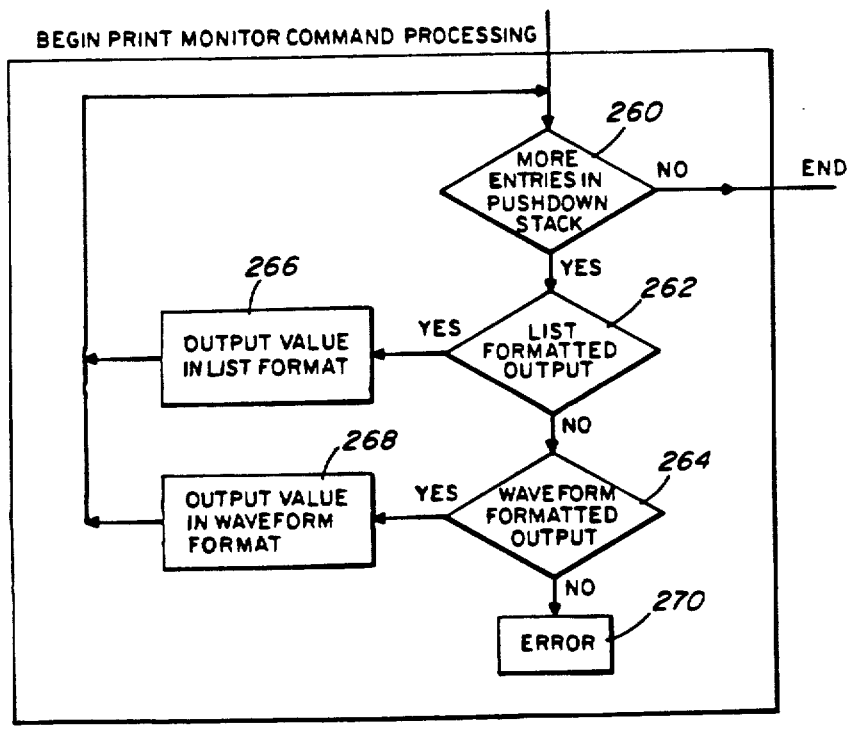

Referring now to FIG. 18, the sampled values of the monitored signals can be printed by examining first the push-down stack, at 260, to determine whether there are any entries. If there are no entries, the print monitoring command processing ends. If there are entries, a determination is made whether they are list formatted in output (at 262) or waveform formatted in output (at 264). Depending upon the format used, the sampled values are displayed at 266 and 268, respectively. In the illustrated embodiment the only formats provided for displaying the output waveforms are the list and waveform formats. Any other output specification format in this illustrated embodiment would result in an error condition as indicated at 270.

The resulting digital system simulation apparatus and method thus enable the user to advantageously and interactively control, during simulation, the tracing of signals in the digital system to be analyzed. Further, the behavior of the system can be approximated better by recognizing and allowing a precise definition of element outputs even though the element inputs can include undefined variables. Furthermore, the apparatus allows efficient and better utilization of system memory by having the capacity for defining multiple outputs of circuit elements where those outputs all have common inputs.

Additions, subtractions, deletions, and other modifications of the illustrated and preferred embodiment of the invention will be apparent to those skilled in the art and are within the scope of the following claims.

What is claimed is:

1. Apparatus for simulating the behavior of a digital circuit, the digital circuit having a plurality of connected circuit elements, said apparatus having means for defining said circuit elements comprising means for defining inputs to said circuit elements having at least four signal levels, said levels including a "0" signal level, a "1" signal level, a high impedance "Z" signal level, and an unknown "X" signal level, means connected to said input defining means for defining outputs of said circuit elements based upon said input signals, and said outputs having at least said four signal levels, and said output defining means including means for providing a "0" or a "1" output signal level even though one or more input signal levels have thereon a "Z" or an "X" signal level.

2. The simulation apparatus of claim 1 further comprising memory means connected to said input defining means for storing predefined input-output relationships for standard circuit building blocks, and means connected to said output defining means for serially determining on a bit-by-bit basis outputs of at least one said circuit element.

3. The simulation apparatus of claim 2 wherein said circuit elements include digital adders.

4. The simulation apparatus of claim 2 wherein said circuit elements include digital subtractors.

5. The simulation apparatus of claim 2 wherein said circuit elements include ANDing and ORing circuitry.

6. A method for operating a digital data processor for simulating the behavior of a digital circuit, said data processor having memory means for storing digital signals, the digital circuit having a plurality of connected circuit elements, the method comprising the steps of defining inputs to said circuit elements based upon input signal having at least four signal levels, said levels including a "0" signal level, a "1" signal level, a high impedance "Z" signal level, and an unknown "X" signal level storing in said memory means digital signals representative of predefined input-output relationships for standard circuit building blocks, serially determining, on a bit-by-bit basis, outputs of a said connected circuit element, defining outputs of said circuit elements based upon said input signals and having at least said four signal levels, and allowing a defined output of a circuit element to assume a "0" or a "1" output signal level even though one or more input signal levels to said circuit element have thereon a "Z" or an "X" signal level.

7. The simulation method of claim 6 further comprising the step of providing definitions of said input and output signal levels for a digital addition circuitry.

8. The simulation method of claim 6 further comprising the step of storing in said memory means input and output signal level definitions for a digital subtraction circuit.

9. The simulation method of claim 6 further comprising the step of providing input and output definitions for ANDing and ORing circuitry.

10. The simulation method of claim 6 further comprising the step of storing in said memory means at least one standard building block defined relationship, said defined standard building block defined relationship having a first input port, a second input prot, and a carry-in input port, and a first output port and a carry-out output port.

11. A method of simulating the behavior of a digital circuit having a plurality of connected circuit elements, the method of comrpising the steps of defining inputs to said circuit elements defining output signal levels for outputs of said circuit elements, establishing a causal relationship between each said circuit element inputs and outputs, tracing the signal value of at least one of said circuit element inputs and outputs for at least a selected change of condition of a logical combination of said connected circuit element inputs and outputs.

displaying messages describing said traced circuit element inputs and outputs at times when said selected condition is attained, evaluating the occurrence of at least one selected Boolean relationship among said combination of inputs and outputs, displaying said trace message whenever the Boolean relationship is satisfied, said evaluating step comprising the steps of parsing said Boolean relationship into elemental conditions, transforming said elemental conditions into event detection circuitry, and inserting said event detection circuitry into said circuit, the behavior of which is to be simulated.

12. Apparatus for simulating the behavior of a digital circuit, the digital circuit having a plurality of connected circuit elements, comprising input-defining means means for defining inputs to said circuit elements, output-defining means connected to said input-defining means for defining output signal levels for outputs of said circuit elements based upon defined relationships with said inputs, relationship-establishing means connected to said output-defining means for establishing functional relationships between at least some of said circuit element inputs and outputs, table look-up means connected to said relationship-establishing means for storing said functional relationships of said establishing means as a plurality of table entries, each entry having an address which is a function of the inputs to a said circuit element, said table having plural output entries for at least one combination of inputs defining a table entry address, said table entry being addressed by said inputs.

13. The simulation apparatus of claim 12 further comprising means for automatically combining separate defined functional relationships in said table wherein each of a plurality of outputs is generated from common inputs.

14. The simulation apparatus of claim 12 wherein said table comprises a table entry which depends upon the state of the circuit element inputs and outputs.

15. A method for simulating the behavior of a digital circuit, the digital circuit having a plurality of connected circuit elements, said method comprising the steps of defining inputs to said circuit elements, defining output signal levels for outputs of said circuit elements based upon said inputs, establishing functional relationships between at least some of said circuit element inputs and outputs, storing said functionally related inputs and outputs in a table look-up memory, said memory being addressed according to said inputs and outputs for a circuit element, and said table look-up memory having plural outputs associated with one said table entry address.

16. The simulation method of claim 15 further comprising the steps of indexing to a memory address based upon the inputs and outputs of a said circuit element, and using said memory address for updating values of plural outputs of said circuit element.

17. The simulation method of claim 16 further comprising the step of using pointers stored in said memory addresses for updating said plural outputs of said circuit element.

18. The simulation method of claim 15 further comprising the step of associating with each table entry, as its input address, the present state of the circuit element inputs and outputs.

19. The simulation method of claim 15 further comprising the step of automatically combining separately defined functional relationships in said table for a circuit element wherein outputs of said circuit element are defined by common inputs.

20. Apparatus for simulating the behavior of connected circuit elements, comprising means for defining inputs to said circuit elements, having at least four signal levels, said levels including a "0" signal level, a "1" signal level, a high impedance "Z" signal level, and an unknown "X" signal level means connected to said input defining means for defining outputs of said circuit elements based upon said input signals, said output having at least four signal levels, wherein said circuit elements include standard circuit building blocks having as inputs, a second input port, and a carry-in port, and as outputs, at least a first output port, and a carry-out port, said output defining means comprising means for providing a "0" or a "1" output signal level event through one or more input signal levels have thereon a "Z" or an "X" signal level, memory means connected to said input-defining means for storing predefined input-output relationships for standard circuit building block, and means connected to said output-defining means for serially determining on a bit-by-bit basis outputs of a connected circuit elements.

21. A method for simulating the behavior of a digital circuit, the digital circuit having a plurality of connected circuit elements, comprising the steps of defining inputs to said circuit elements based upon input signals having at least four signal levels, said levels including a "0" signal level, a "1" signal level, a high impedance "Z" signal level, and an unknown "X" signal level defining outputs of said circuit elements based upon said input signals and having at least said four signal levels, allowing a defined output of a circuit element to assume a "0" or a "1" output signal level even though one or more input signal levels to said circuit element have thereon a "Z" or an "X" signal level, storing predefined input-output relationships for standard circuit building blocks, serially determining on a bit-by-bit basis, outputs of a connected circuit element, and providing at least one standard building blocks having a carry-in input port, and a first output port, and a carry-out output port.

22. Apparatus for simulating the behavior of a digital circuit, the digital circuit having a plurality of connected circuit elements, said apparatus comprising means for defining inputs to said circuit elements, means connected to said input-defining means for defining output signal levels of outputs of said circuit elements, each said circuit element having a defined input/output casual relationship, means connected to said input-output means and with said output-defining means for tracing the signal value of at least one of said circuit element inputs and outputs for at least a selected change of condition of a logical combination of said inputs and outputs, said tracing means comprising means for evaluating the occurrence of at least one selected Boolean relationship among said combination of inputs and outputs, and means coupled with said tracing means and responsive thereto for displaying messages describing said traced circuit element inputs and outputs at times when said selected condition is attained, said displaying means comprising means for displaying said trace message whenever at least a portion of a memory element is updated with changed data, and means responsive to said evaluating means for displaying said trace message whenever said Boolean relationship is satisfied.

23. A method for simulating the behavior of a digital circuit, the digital circuit having a plurality of connected circuit elements, comprising the steps of defining inputs to said circuit elements, defining output signal levels of outputs of said circuit elements, said outputs of each circuit elements having a causal relationship with the inputs of of each said same element, tracing the signal value of at least one of said circuit element inputs and outputs for at least a selected change of condition of a logical combination of said connected circuit element inputs and outputs, displaying messages describing said traced circuit element inputs and outputs at times when said selected condition is attained, selectively displaying said message whenever at least a portion of a memory element is updated with changed data, evaluating the occurrence of at least one selected Boolean relationship among said combination of inputs and outputs, displaying said trace message whenever the Boolean relationship is satisfied, parsing said Boolean relationships into elemental conditions, transforming said elemental conditions into event detection circuitry, and inserting said event detection circuitry into said circuit, the behavior of which is to be simulated.

24. Apparatus for simulating the behavior of a digital circuit, the digital circuit having a plurality of connected circuit elements, comprising means for defining inputs to said circuit elements, means for defining output signal levels for outputs of said circuit elements based upon defined relationships with said inputs, and means for establishing functional relationships between at least some of said circuit element inputs and outputs, a table look-up means for storing said functional relationships of said establishing means as a plurality of table entries, each entry having an address which is a function of the inputs to a said circuit element, means for automatically combining separate defined functional relationships in said table wherein each of a plurality of outputs is generated from common inputs, said table having plural output entries for at least one combination of inputs defining a table entry address, said table entry being addressed by said inputs, and wherein said table comprises a table entry which depends upon the state of the circuit element inputs and outputs.

25. A method for simulating the behavior of a digital circuit, the digital circuit having a plurality of connected circuit elements, said method comprising the steps of defining inputs to said circuit elements, defining output signal levels for outputs of said circuit elements based upon said inputs, establishing functional relationships between at least some of said circuit element inputs and outputs, storing said functionally related inputs and outputs in a table look-up memory, said memory being addressed according to said inputs and outputs for a circuit element, said table look-up memory having plural outputs associated with one said table entry address, indexing to a memory address based upon the inputs and outputs of a said circuit element, using said memory address for updating values of plural outputs of said circuit element, using pointers stored in said memory addresses for updating said plural outputs of said circuit element, associating with each table entry, as its input address, the present state of the circuit element inputs and outputs, and automatically combining separately defined functional relationships in said table for a circuit element wherein outputs of said circuit element are defined by common inputs.

* * * * *